(12) United States Patent
Miller et al.

(10) Patent No.: US 6,327,126 B1
(45) Date of Patent: Dec. 4, 2001

(54) ELECTROSTATIC DISCHARGE CIRCUIT

(75) Inventors: James W. Miller; Michael G. Khazhinsky; Geoffrey B. Hall; Jose A. Camarena, all of Austin; Joseph Chan, Round Rock; Fujio Takeda, Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/494,055

(22) Filed: Jan. 28, 2000

(51) Int. Cl.$^7$ ............................................. H02H 9/00
(52) U.S. Cl. ...................................................... 361/56
(58) Field of Search ................................... 361/56, 91, 111, 361/115, 212

(56) References Cited

U.S. PATENT DOCUMENTS 5,907,464 * 5/1999 Maloney et al. ................. 361/111
5,930,094 * 7/1999 Amerasekera et al. .......... 361/111 X

* cited by examiner

Primary Examiner—Edward H. Tso
(74) Attorney, Agent, or Firm—James L. Clingan, Jr.

(57) ABSTRACT

A circuit (600) provides Electrostatic Discharge (ESD) protection for internal elements in an integrated circuit during an ESD event. The circuit (600) includes cascoded NMOSFETs (614, 616), with the upper NMOSFET (614) connected to voltage divider circuitry (628). The voltage divider circuitry (628) provides a first bias voltage to the gate of the upper NMOSFET (614) during an ESD event and a second bias voltage during normal operation. Preferably, the first bias voltage is approximately ½ of the drain voltage of the upper NMOSFET (614). Under these bias conditions the cascoded NMOSFETs exhibit a maximum voltage threshold for initiation of parasitic lateral bipolar conduction.

20 Claims, 4 Drawing Sheets

ELECTROSTATIC DISCHARGE CIRCUIT

FIELD OF THE INVENTION

The present invention relates to semiconductor circuits, and in particular, the present invention relates to semiconductor circuits for providing protection against Electrostatic Discharge (ESD) events.

BACKGROUND OF THE INVENTION

An integrated circuit may be subjected to an Electrostatic Discharge (ESD) event both in the manufacturing process and in the ultimate system application. The energy associated with this transient discharge can easily damage the fragile devices present in a modern integrated circuit (IC). External pins or pads form the connection points for the integrated circuit to the outside world and therefore serve as pathways for ESD events. An ESD event applied to a pad may couple a voltage exceeding a thousand volts to circuitry connected to the pad. Devices and circuits connected to Input/Output (I/O) pads, including the output pull-down and pull-up buffers, tend to be particularly susceptible to ESD damage. Modern integrated circuits typically require additional ESD circuitry in order to harmlessly shunt ESD currents around the fragile buffers.

FIG. 1 illustrates a simple Input/Output (I/O) circuit 100. The I/O pad 108 is connected between a positive power supply rail (VDD) 104 and a negative power supply rail (VSS) 106. An N-channel MOSFET (NMOSFET) Transistor 114 is connected between the I/O pad 108 and the VSS power supply rail 106. A P-channel MOSFET (PMOSFET) 118 is connected between the I/O pad 108 and the VDD power supply rail 104. NMOSFET 114 serves as the output pull-down buffer while PMOSFET 118 serves as the output pull-up buffer. The gates of NMOSFET 114 and PMOSFET 118 are each connected to output predriver circuitry (not shown).

FIG. 1 also illustrates a prior art ESD protection network consisting of ESD diodes 110 and 112 and an active MOSFET rail clamp circuit 116. Diodes 110 and 112 are used to shunt ESD current between the I/O pad 108 and the VDD and VSS power rails. The active MOSFET rail clamp 116 is comprised of an ESD detector circuit 102 and a shunting device 103 connected between the VDD rail 104 and the VSS rail 106. The rail clamp circuit 116 is used to shunt ESD current between the power supply rails 104 and 106 and thereby protect sensitive internal elements in the IC from damage. The shunting device 103 is typically a large NMOSFET. An example of such a rail clamp circuit is illustrated in FIG. 3 of U.S. Pat. No. 5,946,177 issued to Miller et al. on Aug. 31, 1999, which is incorporated by reference herein. The rail clamp circuit in the Miller et al. patent includes a shunting device and an ESD detector circuit. The ESD detector circuit senses an ESD event and activates the shunting device into a low resistance conductive state in response to the ESD event.

Integrated circuits are often most susceptible to damage during positive ESD events coupled onto an I/O pad referenced to grounded VSS. The primary intended ESD dissipation path for this event in I/O circuit 100 is as follows. The I/O pad 108 voltage rises rapidly as the positive ESD event is applied. Diode 110 forward biases, allowing the VDD rail voltage to increase as well. The ESD detector circuit 102 in rail clamp 116 senses the ESD event, and turns on shunting device 103, allowing the transient ESD current to flow harmlessly between VDD and VSS. During this ESD event, the I/O pad voltage rises to a peak level set by the sum of the voltage drops as the peak current of the applied ESD event flows through the intended dissipation path.

It is important to note that the NMOSFET buffer 114 provides an alternate dissipation path for the ESD event described above, and for this reason, is often the most fragile device in the I/O circuit. During the ESD event, the NMOSFET 114 may conduct as a lateral parasitic NPN bipolar transistor 120, with the NMOSFET drain diffusion, source diffusion, and local P-type substrate region forming the lateral bipolar collector, emitter, and base regions, respectively. While the parasitic NPN transistor 120 is shown as device separate from NMOSFET 114 in FIG. 1, it should be understood that these are formed from a single device with two modes of electrical operation. FIG. 2 shows a typical Current-Voltage (IV) curve for a NMOSFET output buffer transistor. The gate terminal is assumed grounded during the measurements. As the drain (I/O pad) voltage for the NMOSFET rises due to an applied ESD event, the device initially conducts via avalanche generation at the drain to substrate diode junction. The avalanche region 202 is shown in FIG. 2. Avalanche generated holes drift in the P-substrate region through local spreading resistance 115 (FIG. 1) to the VSS rail, elevating the local substrate potential. Eventually, at a threshold known as first breakdown ($V_{T1}$, $I_{T1}$), the NPN base-emitter junction diode will forward bias, signaling the turn-on of the lateral parasitic bipolar transistor. The device will then exhibit a sudden negative resistance transition and enter the parasitic lateral bipolar region of operation 204. The parasitic bipolar transistor may be capable of conducting significant ESD current in this bipolar region before failure. However, if the drain voltage rises above a second current-voltage threshold, defined as $V_{T2}$-$I_{T2}$, the device will suffer permanent thermal damage.

In summary, the ESD protection network in FIG. 1 utilizes a series combination of diode 110 and rail clamp 116 to provide the primary ESD dissipation path for positive I/O events with respect to grounded VSS. The lateral NPN transistor 120 parasitic to the pull-down buffer NMOSFET 114 provides a parallel but potentially fragile alternate conduction path. This fragile device will fail if the I/O pad voltage exceeds $V_{T2}$, the ESD failure voltage for the parasitic lateral NPN. This failure voltage defines the margin of operation for the primary ESD dissipation path. Therefore, diode 110, rail clamp 116, and their interconnections must be designed to dissipate the required ESD current (typically amperes) while holding the I/O pad voltage to below $V_{T2}$ for the pull-down buffer (typically 6–10V). This requirement is becoming increasingly difficult to meet. As integrated circuit technologies have scaled, the lateral NPN second breakdown voltage and current threshold ($V_{T2}$, $I_{T2}$) have reduced dramatically, often to the point where the intended ESD protection path can no longer provide adequate ESD protection. Therefore, a limitation with the conventional protection circuit 100 is poor ESD resistance due to the increasing ESD susceptibility of the NMOSFET pull-down buffer 114.

FIG. 3 illustrates a second type of I/O circuit 300 which is designed to tolerate input voltages in excess of the maximum specified power supply voltage for the MOSFETs which form the integrated circuit. For example, in certain applications, the IC may operate with a maximum internal power supply voltage (VDD) of 3.3V but must tolerate up to 5.5V at the I/O pads. In this mixed voltage I/O, both the pull-up and pull-down buffers must be modified as compared to the I/O described in FIG. 1. The pull-down buffer is formed by two NMOSFETs placed in a series or cascoded configuration. A first NMOSFET 313 and a second NMOS- FET 314 are connected in series between the I/O pad 308 and the VSS power supply rail 306. The gate of NMOSFET 313 is connected to the positive power supply rail VDD 304. The gate of NMOSFET 314 is connected to output predriver circuitry (not shown). The cascoded NMOSFETs provide a convenient means of stepping a higher than VDD input voltage across two gate oxides. For example, with 5.5V at the I/O pad, and 3.3V at the gate of NMOSFET 313, no voltage in excess of the 3.3V allowable maximum is seen across the gate oxide of either NMOSFET 313 or NMOSFET 314.

The PMOSFET pull-up buffer in FIG. 3 is also modified as compared to the buffer in FIG. 1. The modifications are required in order to eliminate forward bias conduction in the parasitic P+ drain diffusion to NWELL diode in the event the I/O pad voltage is elevated above VDD. PMOSFET 318 is placed in an NWELL control by tracking well circuit 319. The tracking well circuit holds the NWELL of PMOSFET 318 at VDD potential whenever the I/O pad voltage is less than or equal to VDD. In the event the I/O pad rises above VDD, the tracking well circuit 319 ensures that the PMOSFET NWELL voltage tracks the I/O pad voltage. This prevents unwanted I/O pad to VDD conduction through the parasitic diode.

FIG. 3 also illustrates a prior art ESD protection network for this mixed voltage I/O consisting of diode 312, diode string 310, and active MOSFET rail clamp circuit 316. Diode string 310 is implemented to ensure no forward bias conduction from the I/O pad to VDD under the specified VDD level and the maximum tolerable I/O pad voltage. As described above, integrated circuits are often most susceptible to damage during positive ESD events coupled onto the I/O pad referenced to grounded VSS. The intended ESD dissipation path for this event in protection circuit 300 is as follows. The I/O pad 308 voltage rises rapidly as the ESD event is applied. Diode string 310 forward biases as the I/O pad voltage rises above the string stand-off voltage. The ESD detector circuit 302 in rail clamp 316 senses the ESD event, and enables shunting device 303, allowing the transient ESD current to flow between VDD and VSS. During this ESD event, the I/O pad voltage rises to a peak level set by the peak current of the applied ESD event, the stand-off voltage of the diode string, and the net resistance of the intended dissipation path.

As in the case of a single NMOSFET pull-down buffer (FIG. 1), the cascoded NMOSFET buffer (FIG. 3) can turn on and conduct as a lateral parasitic bipolar transistor during a positive ESD event between the I/O pad and VSS. This provides a potentially fragile alternate ESD conduction path in parallel with the intended primary conduction path. As shown in FIG. 3, a lateral parasitic bipolar transistor 320 is formed from components of both NMOSFETs 313 and 314. The lateral NPN collector, emitter, and base are formed from the drain of NMOSFET 313 (tied to the I/O pad), the source of NMOSFET 314 (tied to VSS), and the local P-substrate region, respectively. It is known that the lateral NPN formed from cascoded pull-down buffers typically exhibit a higher bipolar turn-on voltage ($V_{T1}$) than the single NMOSFET buffer configuration. (See, S. Voldman, J. Never, S. Holmes, and J. Akkisson, "Linewidth Control Effects on MOSFET ESD Robustness," the 1996 EOS/ESD Symposium Proceedings, p. 101; and W. Anderson and D. Krakauer, "ESD Protection for Mixed-Voltage I/O Using NMOS Transistors Stacked in a Cascode Configuration," the 1998 EOS/ESD Symposium Proceedings, p. 54.) This is demonstrated in FIG. 4 which compares the bipolar turn-on IV characteristics of example single (Curve A) and cascoded (Curve B) NMOSFET output buffers. The gates of all NMOSFETs are held to VSS during the measurements for Curve A and Curve B. This plot only shows bipolar turn-on characteristics through first breakdown. For clarity, datapoints in the bipolar conduction region are not shown. It can be seen that, in this example data, $V_{T1}$ for the single NMOSFET buffer is about 8.0V, while $V_{T1}$ for the cascoded NMOSFET buffer is about 11V. This difference in $V_{T1}$ is primarily due to the increased emitter to collector spacing in the cascoded NMOSFET configuration as compared to the single NMOSFET configuration. This increased emitter to collector spacing reduces the lateral bipolar gain, and therefore increases the bipolar trigger voltage.

In summary, the ESD protection network in FIG. 3 utilizes a series combination of diode string 310 and rail clamp 316 to provide the primary ESD dissipation path for positive I/O events with respect to grounded VSS. The lateral NPN transistor 320 parasitic to the cascoded pull-down buffer (NMOSFET 313 and NMOSFET 314), provides a parallel but potentially fragile alternate conduction path. This fragile device will fail if the I/O pad voltage exceeds $V_{T2}$, the ESD failure voltage for the parasitic lateral NPN 320. As described above, the lateral NPN second breakdown voltage and current threshold ($V_{T2}$, $I_{T2}$) has reduced dramatically as semiconductor device geometries have scaled, often to the point where the intended ESD protection path can no longer provide adequate ESD protection. Therefore, a limitation with the mixed voltage I/O circuit 300 is poor ESD resistance due to the increasing ESD susceptibility of the cascoded NMOSFET pull-down buffer.

In general, efforts in the industry to maximize the ESD robustness of the pull-down buffer have focused on means to maximize the lateral NPN parasitic bipolar second breakdown failure current ($I_{T2}$). This is true for both single and cascoded output buffer configurations. With this approach, the NPN bipolar parasitic to the pull-down output buffer is expected to enter the bipolar conduction region, and dissipate some portion of the total ESD current in parallel with the primary ESD dissipation path. However, the trend of falling $I_{T2}$ as process geometries are scaled, may eventually render this approach ineffective.

BRIEF DESCRIPTION OF THE DRAWINGS

The present invention is illustrated by way of example and not limited in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As mentioned above, prior art approaches to maximize the ESD robustness of a pull-down buffer have focused on means to maximize the lateral NPN parasitic bipolar second breakdown failure current ($I_{T2}$). An alternate to this and other prior art approaches is to maximize the lateral NPN bipolar trigger voltage ($V_{T1}$). With this approach, the parasitic buffer NPN is prevented from entering bipolar conduction during ESD. This necessarily requires that the primary ESD dissipation path must dissipate the entire ESD current while holding the I/O pad voltage below $V_{T1}$ for the pull-down buffer. It turns out that there are few realistic process or design options for significantly increasing the lateral NPN $V_{T1}$ with the single NMOSFET buffer configuration. However, with the cascoded NMOSFET buffer configuration, the lateral NPN $V_{T1}$ can be increased significantly. This is the focus of the present invention.

Figure 3:
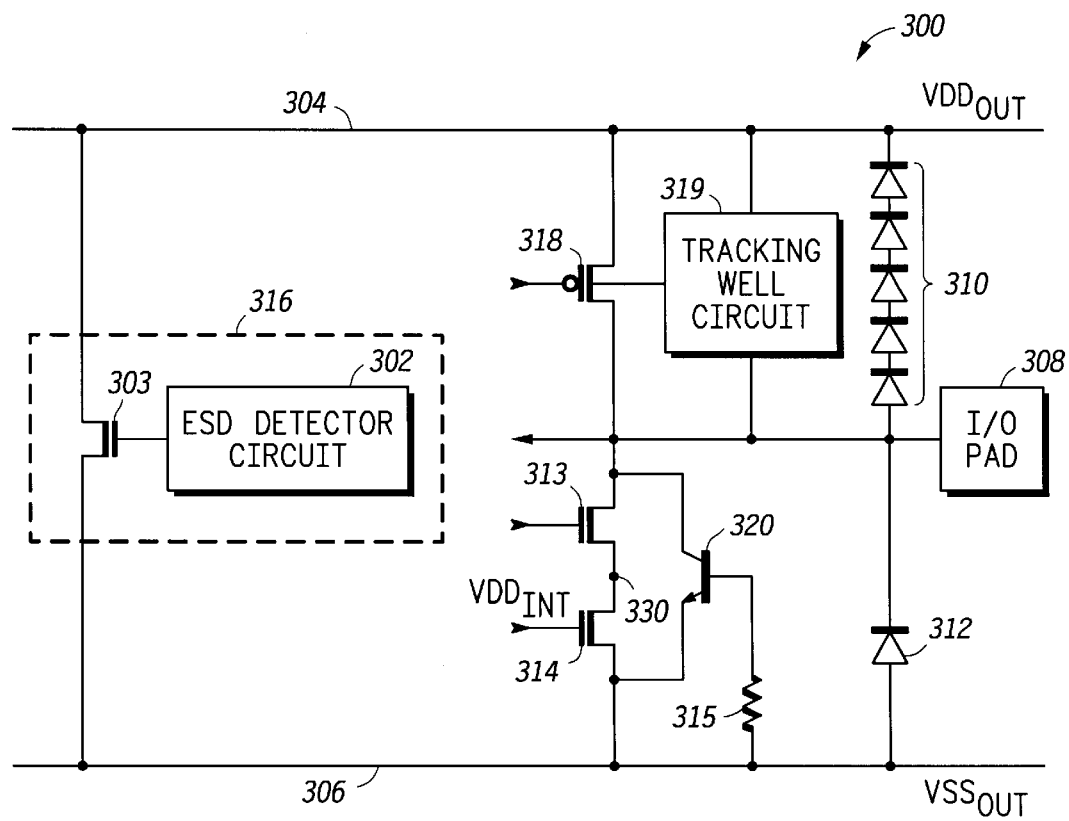
FIG. 3 is a prior art mixed voltage input/output circuit with ESD protection.
Figure 4:
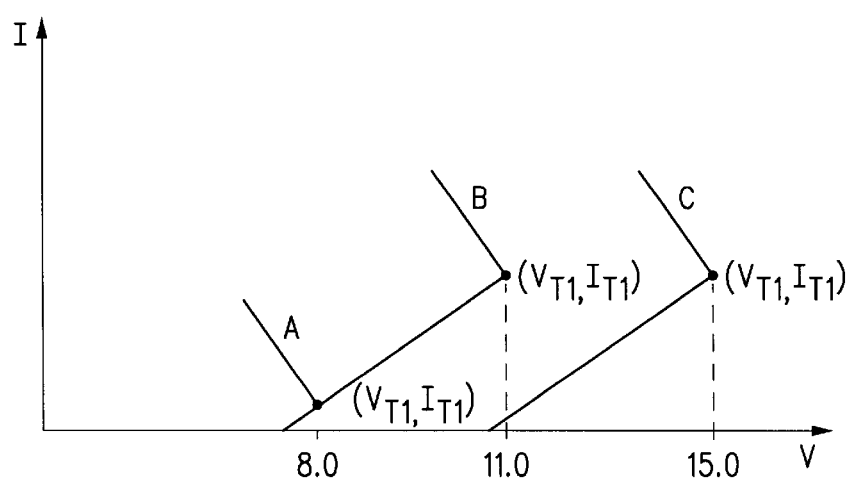
FIG. 4 is an IV plot comparing the lateral NPN bipolar turn-on characteristics of single and cascoded NMOSFET buffer configurations.
Figure 5:
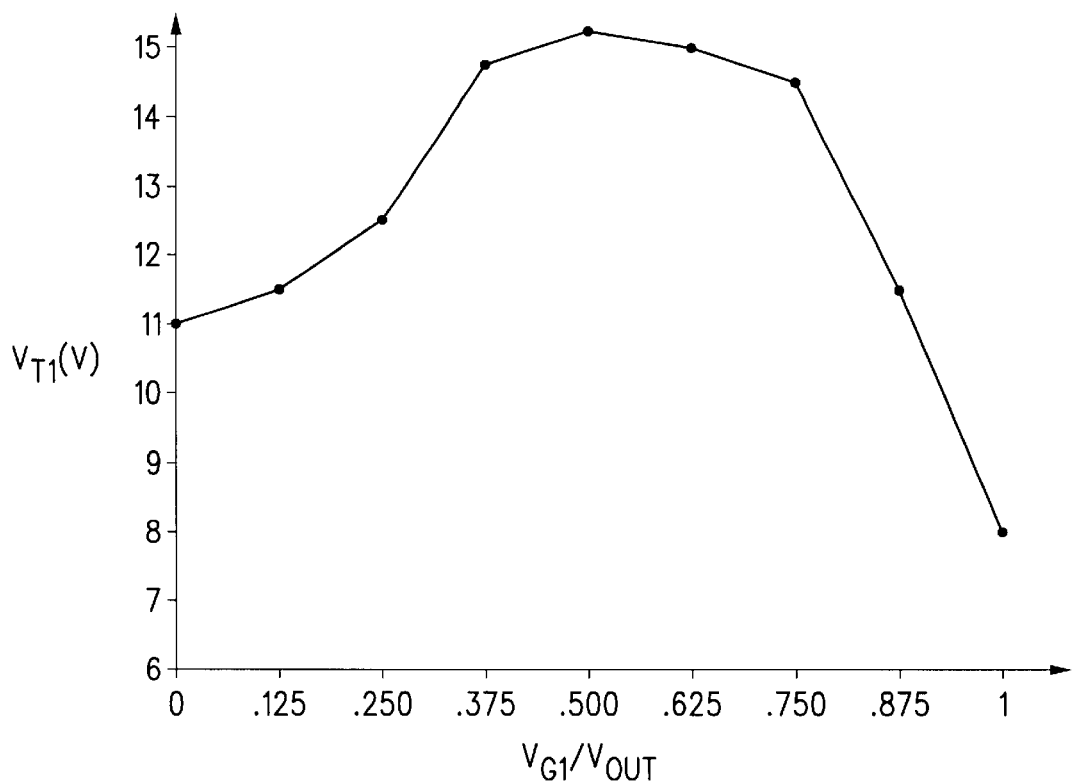
FIG. 5 is a plot of the bipolar turn-on threshold ($V_{T1}$) of cascoded NMOSFETs as a function of an applied upper gate bias ($V_{G1}$)

As can be seen in FIG. 4, the change from a single (Curve A) to a cascoded (Curve B) pull-down buffer configuration produced a significant increase in the lateral NPN $V_{T1}$. This data was gathered with all NMOSFET gates held to VSS during measurements. Curve C in FIG. 4 illustrates the improvement in the cascoded NMOSFET lateral NPN $V_{T1}$ possible with an elevated bias on the gate of the upper NMOSFET 313 (FIG. 3). An example of a circuit for providing a bias voltage on the gate is described below. The upper gate bias voltage will be referred to as $V_{G1}$. In the example illustrated by Curve C, $V_{G1}$ was set to a constant one-half fraction of the I/O pad voltage during the measurement. As can be seen in FIG. 4, the cascoded NMOSFET lateral NPN $V_{T1}$ improved from about 11V with $V_{G1}$ set to VSS, to about 15V with $V_{G1}$ set to one-half of the I/O pad voltage. It turns out that the maximum $V_{T1}$ for the lateral NPN formed from cascoded NMOSFET buffers is produced when the upper NMOSFET gate voltage ($V_{G1}$) is set to about one-half of the I/O pad potential ($V_{OUT}$) during the ESD event. This is shown in FIG. 5, which illustrates the change in the lateral NPN $V_{T1}$ as $V_{G1}$ is increased from VSS potential to the full I/O pad potential during the measurement. $V_{T1}$ was seen to increase from about 11V with $V_{G1}$ at VSS, to about 15V with $V_{G1}$ set to one-half of $V_{OUT}$, and then fall to a minimum of about 9.0V as $V_{G1}$ was increased to the full I/O pad voltage.

The initial increase in $V_{T1}$ with increasing $V_{G1}$ is due to reduced avalanche generation at the upper NMOSFET drain to P-substrate diode. As $V_{G1}$ is increased to a higher fraction of the I/O pad voltage, the gate to drain component of the diode junction electric field is reduced. This reduced electric field results in a lower rate of avalanche generation for a given I/O pad voltage. This can be seen by comparing curves B and C in FIG. 4. Note that the threshold current for bipolar turn-on ($I_{T1}$) is the same for both curves. However, curve C exhibits a higher $V_{T1}$ since the I/O pad voltage required to reach $I_{T1}$ is greater. The drop in $V_{T1}$ as $V_{G1}$ is increased beyond one-half the I/O pad voltage is due to lateral NPN parasitic bipolar turn-on in the lower NMOSFET 314 (FIG. 3) only. Note that as $V_{G1}$ is increased above the MOSFET threshold voltage (Vtn), the intermediate node 330 (FIG. 3) between NMOSFETs in the cascoded configuration will be elevated in potential. The lower NMOSFET gate ($V_{G2}$) is assumed held to VSS and cannot conduct MOSFET current. During an ESD event, for a given $V_{G1}$ bias condition, the intermediate node will be elevated to $V_{G1}$–Vtn. As the ratio of $V_{G1}$ to the I/O pad voltage is increased, a point will be reached in which the node between NMOSFETs rises to the bipolar turn-on threshold ($V_{T1}$) for a single NMOSFET. As shown in Curve A in FIG. 4, a single NMOSFET will fire as a bipolar when its drain diffusion reaches about 8V. Therefore, with $V_{G1}$ greater than about one-half of the I/O pad voltage, the intermediate voltage at node 330 may exceed $V_{T1}$ for the lower NMOSFET 314. Under these conditions, ESD current will flow through NMOSFET 313 (operating as a MOSFET in saturation) to the intermediate node 330. From node 330, the ESD current will flow to the VSS rail through the lateral bipolar NPN parasitic to NMOSFET 314.

The application of a bias voltage ($V_{G1}$) on the gate of the upper NMOSFET 313 in a cascoded pull-down buffer configuration provides a convenient means of maximizing the bipolar turn-on voltage for the parasitic lateral NPN transistor 320. Setting $V_{G1}$ to about one-half of the I/O pad voltage generally produces the maximum possible $V_{T1}$. This increased $V_{T1}$ for the fragile pull-down buffer directly translates into increased margin for operation of the intended primary ESD dissipation network.

While several embodiments of the present invention will be described in detail below, the present invention includes a circuit providing ESD protection for internal elements in an integrated circuit during an ESD event. In general, the circuit includes a voltage bias circuit which, in response to an ESD event, provides a bias voltage to the upper gate of a stacked or cascoded NMOSFET pair. The bias voltage is preferably equal to approximately ½ of the applied upper NMOSFET drain voltage. Preferably, the bias voltage is produced by a voltage divider circuit. Under this bias condition, the cascoded NMOSFETs exhibit the maximum voltage threshold ($V_{T1}$) for initiation of parasitic lateral NPN bipolar action. This increase in the bipolar turn-on voltage ($V_{T1}$) translates directly into improved ESD robustness for the circuit. The voltage divider circuit can be realized in various fundamental configurations, but each of the embodiments shown includes two resistive elements with their shared node coupled to the upper NMOSFET gate. It is recognized that other embodiments may include capacitive elements in place of the resistive elements. Additional elements are included in the preferred embodiments so that, during normal operation, the voltage divider circuit is disabled, and the upper NMOS gate is coupled to an appropriate power supply rail.

"Normal operation" is intended to refer to the time period when the integrated circuit is installed in a system application and is powered up. "ESD event" is intended to refer to the time period when the integrated circuit is not in normal operation and is exposed to high voltages which are capable of damaging the integrated circuit. ESD events often occur during handling and testing of the IC before installation in the system application.

Figure 6:
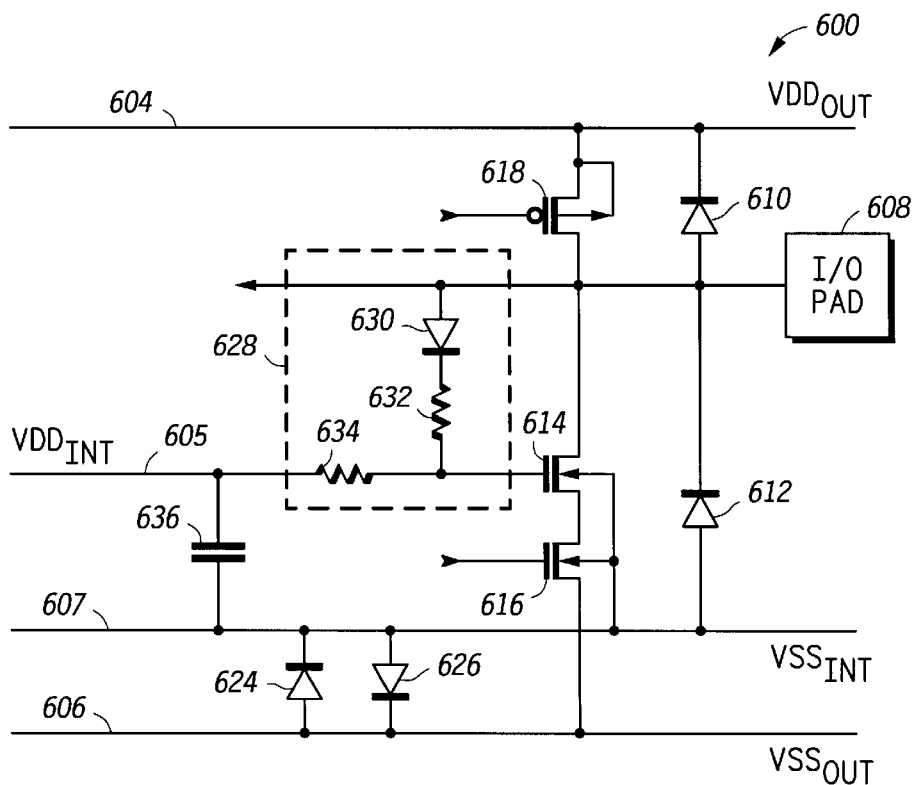
FIG. 6 illustrates one embodiment of the present invention.

FIG. 6 shows a schematic diagram of a first embodiment of an ESD protection circuit 600 of the present invention. The ESD protection circuit 600 includes power supply rail 604 ($VDD_{OUT}$), power supply 605 ($VDD_{INT}$), power supply rail 607 ($VSS_{INT}$), and power supply rail 606 ($VSS_{OUT}$). Power supply rails 604 and 606 provide power for the I/O buffers. Power supply rails 605 and 607 provide power for core circuitry internal to the IC. An input/output (I/O) pad 608 is connected to the power supply rails 604 and 607 via diodes 610 and 612. A primary ESD dissipation path is formed from the I/O pad 608 to the power supply rail 607 via a series combination of diode 610, power supply rail 604, and a conventional rail clamp circuit (not shown).

First (upper) and second (lower) NMOSFETs 614 and 616 are connected in series (or cascoded) between the I/O pad 608 and the power supply rails 607 and 606. The NMOSFETs 614 and 616 together form the output pull-down buffer. A first PMOSFET 618 is connected between the I/O pad 608 and the power supply rail 604. PMOSFET 618 forms the output pull-up buffer. The gates of the NMOSFET 616 and PMOSFET 618 are each connected to predriver circuitry (not shown).

FIG. 6 also shows voltage divider circuitry 628 which is used to provide a first bias voltage ($V_{G1}$) to the gate of the first NMOSFET 614 during an ESD event and a second bias voltage during normal operation of the ESD protection circuit 600. The voltage divider circuit 628 includes the series combination of a diode 630 and a resistive element 632 connected between the gate of the NMOSFET 614 and the I/O pad 608. A second resistive element 634 is connected between the gate of the NMOSFET 614 and the power supply rail 605. During normal operation of the circuit 600, the gate of NMOSFET 614 is pulled to the power supply rail 605 ($VDD_{INT}$) potential through resistive element 634. It is assumed that during normal operation, the voltage of the I/O pad 608 ($V_{out}$) may not exceed $VDD_{INT}$, therefore diode 630 must remain reverse biased and non-conductive. During an ESD event applied to the I/O pad 608 of the unpowered integrated circuit, current will flow from the I/O pad, through diode 630, resistive element 632, and resistive element 634 and begin charging the core $VDD_{INT}$ to $VSS_{INT}$ chip capacitance 636. Under these conditions, the resistive elements 632 and 634 form a voltage divider which drives the gate of the first NMOSFET 614 to a desired voltage, preferably approximately ½ of the voltage of the I/O pad 608 ($V_{out}$). Resistance values for the resistive elements 632 and 634 may be set to achieve the desired fraction of ½ $V_{out}$. These resistance values should also be set high enough to ensure that the core $VDD_{INT}$ to $VSS_{INT}$ chip capacitance 636 is not substantially charged during the duration of the ESD event.

The circuit 600 illustrated in FIG. 6 will function properly as long as the power supply rail 605 ($VDD_{INT}$) is decoupled from the power supply rail 604 ($VDD_{OUT}$), and as long as the voltage of power supply rail 604 ($VDD_{OUT}$) does not exceed the voltage of power supply rail 605 ($VDD_{INT}$). By applying a bias voltage of approximately one-half of Vout to the gate of the NMOSFET 614 during an ESD event, the threshold voltage for bipolar turn-on ($V_{T1}$) in the lateral NPN transistor parasitic to NMOSFETs 614 and 616 is maximized. This increased $V_{T1}$ for the fragile pull-down buffer directly translates into increased margin for operation of the intended primary ESD dissipation network.

FIG. 6 also shows diodes 624 and 626 connected between the power supply rails 606 and 607. The diodes 624 and 626 are connected in parallel to each other in opposite directions to provide bi-directional ESD protection between the two power rails 606 and 607. As a result, the power supply rails 606 and 607 are isolated over small voltage ranges (+/− 0.6V). For the larger voltage ranges typical during an ESD event, the rails are coupled together by the diodes 624 and 626. The diagrams shown in FIG. 7 and FIG. 8 include similar diodes 724, 726, 824, and 826.

In the schematic diagram shown in FIG. 6, PMOSFET 618 and diode 610 are configured so that, during normal operation, the I/O pad 608 voltage may not exceed the voltage of power supply rail 604 ($VDD_{OUT}$). It should be obvious that ESD protection circuit 600 may be modified to tolerate higher than $VDD_{OUT}$ I/O pad voltages by placing PMOSFET 618 in a tracking well and converting diode 610 to a diode string with an appropriate number of diodes in series. An explanation for these modifications has been described in reference to the mixed voltage I/O circuit in FIG. 3. The voltage divider circuitry 628 and cascoded NMOSFET output buffer (NMOSFETs 614 and 616) in FIG. 6 would be unaffected by these modifications. The ESD protection circuits shown in FIG. 7 and FIG. 8 may be similarly modified to support higher than $VDD_{OUT}$ I/O pad input voltages.

Figure 7:
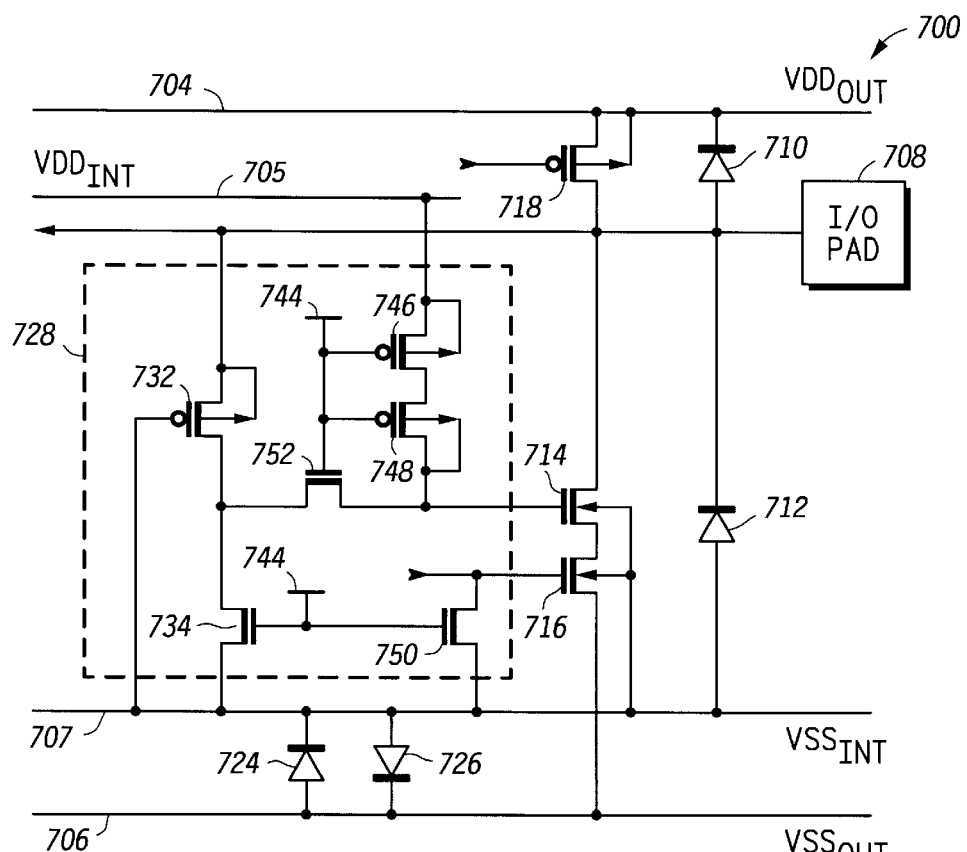
FIG. 7 illustrates another embodiment of the present invention.

FIG. 7 shows another embodiment of the present invention. FIG. 7 shows a schematic diagram of an ESD protection circuit 700 including power supply rail 704 ($VDD_{OUT}$), power supply rail 705 ($VDD_{INT}$), power supply rail 706 ($VSS_{OUT}$), and power supply rail 707 ($VSS_{INT}$). An I/O pad 708 is connected to the power supply rails 704 and 707 via diodes 710 and 712. A primary ESD dissipation path is formed from the I/O pad 708 to the power supply rail 707 via a series combination of diode 710, power supply rail 704, and a conventional rail clamp circuit (not shown).

First (upper) and second (lower) cascoded NMOSFETs 714 and 716 are connected between the I/O pad 708 and the power supply rails 707 and 706. A first PMOSFET 718 is connected between the I/O pad 708 and the power supply rail 704. The gates of the NMOSFET 716 and the PMOSFET 718 are each connected to output buffer predriver circuitry (not shown).

Figure 1:
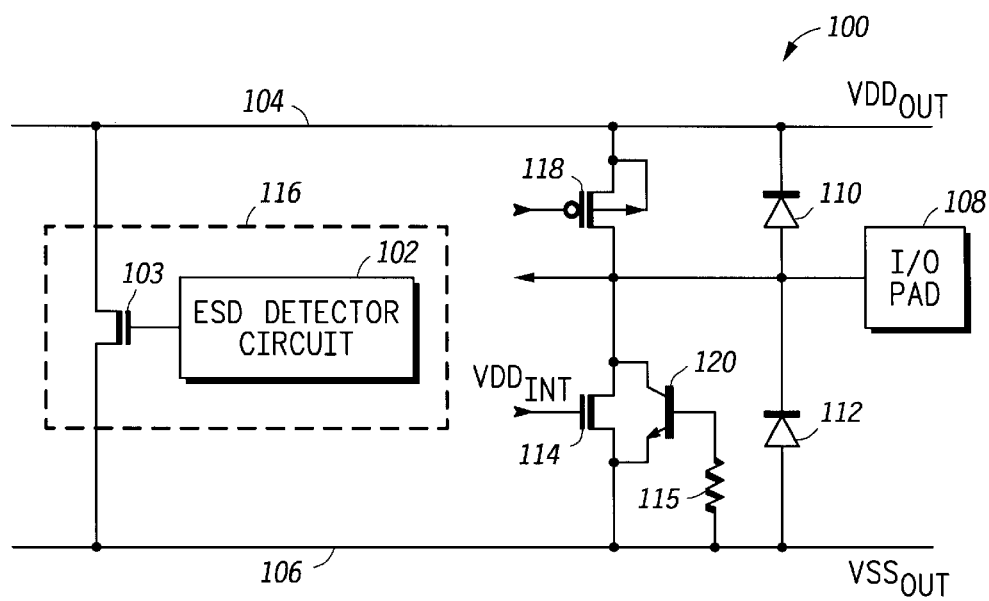
FIG. 1 is a prior art input/output circuit with ESD protection.
Figure 2:
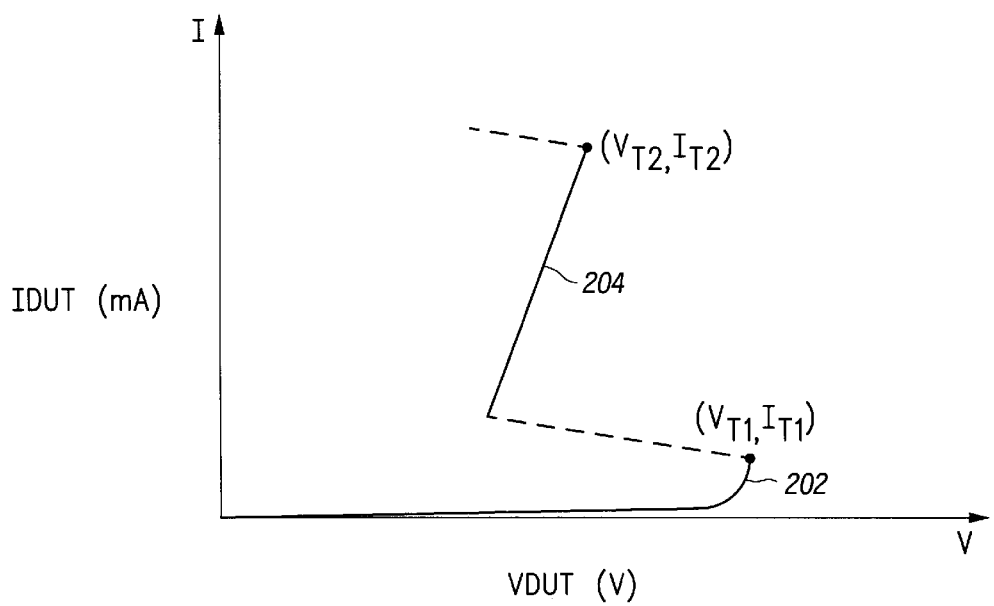
FIG. 2 is an IV plot for a single NMOSFET operating as a lateral NPN parasitic bipolar transistor.

FIG. 7 also shows voltage divider circuit 728 which is used to provide a first bias voltage to the gate of the first NMOSFET 714 during an ESD event and a second bias voltage during normal operation. PMOSFET 732 and NMOSFET 734 serve as the two resistive elements in the voltage divider circuit. The voltage divider circuit 728 is controlled by an ESD signal generated external to circuit 700. This ESD signal is applied to node 744 in FIG. 7. As an example, the output of the ESD detector circuit 102 contained within rail clamp circuit 116 shown in FIG. 1, may provide an appropriate ESD signal to voltage divider circuit 728. Note that any type of circuit capable of sensing an ESD event can be used to generate the ESD signal and function as an ESD detector circuit. During normal operation of the ESD circuit 700, the node 744 is assumed held low by the external ESD detector circuit. With node 744 held low, PMOSFETs 746 and 748 are gated on to pull the gate of the first NMOSFET 714 to the voltage of power supply rail 705 ($VDD_{INT}$). Note that two PMOSFETs 746 and 748 are connected drain to drain to eliminate parasitic P+ diffusion to NWELL diode conduction between the power supply rail 705 and the gate of NMOSFET 714. In applications where this diode conduction is not a concern, PMOSFET 748 may be eliminated and the drain of PMOSFET 746 may be connected directly to the gate of NMOSFET 714. With the node 744 held low during normal operation, the NMOSFET 752 is off, isolating the resistive voltage divider elements (PMOSFET 732 and NMOSFET 734) from the gate of the first NMOSFET 714.

During an ESD event, the node 744 is driven to the $VDD_{OUT}$ power rail potential which turns off the PMOSFETs 746 and 748. At the same time, the NMOSFETs 752 and 734 are turned on. NMOSFET 752 acts as a pass gate, allowing the gate of the first NMOSFET 714 to be connected to the node formed between the two resistive elements in the voltage divider circuit (PMOSFET 732 and NMOSFET 734). PMOSFET 732, gated to the $VSS_{INT}$ power rail 707, is assumed always on. As NMOSFET 734 turns on, current may flow from the I/O pad 708, through PMOSFET 732 and NMOSFET 734, to the $VSS_{INT}$ power rail. The drain to source resistances of PMOSFET 732 and NMOSFET 734 are adjusted to ensure that, during an ESD event, the node formed between them will be driven to a voltage equal to approximately ½ the voltage applied to the I/O pad 708. NMOSFET 752 is gated on to ensure that this voltage is coupled onto the gate of the first NMOSFET 714.

NOSFET 750 provides an additional function for voltage divider circuit 728. As node 744 is pulled high in response to a detected ESD event, NMOSFET 750 turns on, pulling the gate of the second NMOSFET 716 to the potential of the $VSS_{INT}$ power rail 707. A concern during an ESD event is that predriver circuitry connected to the gate of the second NMOSFET 716 may couple a fraction of the applied ESD voltage to this gate. To ensure the maximum $V_{T1}$ for the cascoded NMOSFET buffer, it is important that this second NMOSFET gate be held strongly "off". The NMOSFET 750 is used to pull the gate of the second NMOSFET 716 to the power supply rail 707 during an ESD event. The NMOSFET 750 and the external ESD signal may be used independently of the remaining elements in voltage divider circuit 728.

Figure 8:
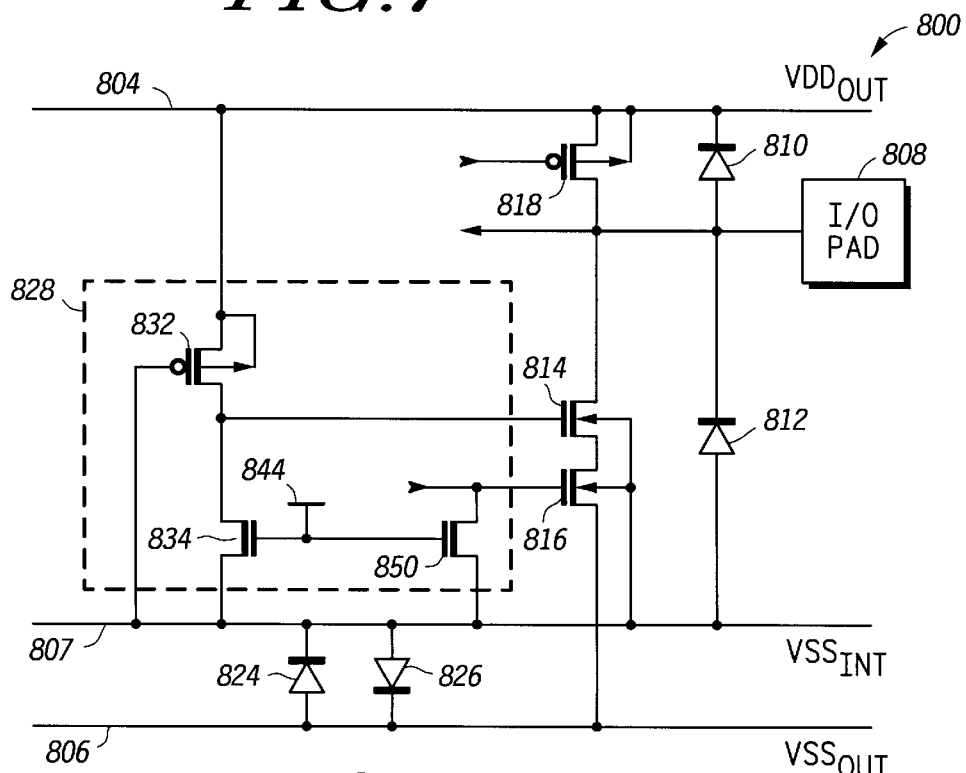
FIG. 8 illustrates another embodiment of the present invention.

FIG. 8 shows another embodiment of the present invention. FIG. 8 shows a schematic diagram of an ESD protection circuit 800 including power supply rail 804 ($VDD_{OUT}$), power supply rail 806 ($VSS_{OUT}$), and power supply rail 807 ($VSS_{INT}$). An I/O pad 808 is connected between power supply rails 804 and 807 via diodes 810 and 812. An ESD dissipation path is provided between I/O pad 808 and one of the power supply rails 806 or 807 by diode 810, power supply rail 804, and conventional rail clamp circuitry (not shown).

First (upper) and second (lower) cascoded NMOSFETs 814 and 816 are connected between the I/O pad 808 and the power supply rails 807 and 806. A first PMOSFET 818 is connected between the I/O pad 808 and the power supply rail 804. The gates of the NMOSFET 816 and PMOSFET 818 are each connected to output buffer predriver circuitry (not shown).

FIG. 8 also shows voltage divider circuit 828 which is used to provide a first bias voltage to the gate of the first NMOSFET 814 during an ESD event and a second bias voltage during normal operation. Voltage divider circuit 828 is comprised of PMOSFET 832, NMOSFET 834 and NMOSFET 850. PMOSFET 832 and NMOSFET 834 serve as the two resistive elements in the voltage divider circuit. The gate of the first NMOSFET 814 is connected to the shared node between the PMOSFET 832 and NMOSFET 834. PMOSFET 832, gated to the $VSS_{INT}$ power rail 807, is assumed always on. The gates of NMOSFETs 850 and 834 are each connected to node 844. NMOSFET 850 is connected between the gate of NMOSFET 816 and power supply rail 807.

As described above with reference to FIG. 7, it is assumed that an ESD signal is generated externally to voltage divider circuit 828 in response to an ESD event. The ESD signal is provided to the node 844 to control the operation of the NMOSFETs 834 and 850. During normal operation of the ESD circuit 800, the node 844 is assumed to be held low by the external ESD signal. NMOSFET 834 is therefore turned off, allowing PMOSFET 832 to pull the gate of first NMOSFET 814 to the power supply rail 804 ($VDD_{OUT}$). The PMOSFET 832 is preferably sized to ensure that the gate of first NMOSFET 814 is held to power supply rail 804 during fast I/O transitions. With the node 844 held low, the NMOSFET 850 is also turned off, allowing normal operation of the pull-down buffer predriver circuit.

During an ESD event, the node 844 is driven high by the external ESD signal. As a result, the NMOSFET 850 turns on and holds the gate of NMOSFET 816 at the voltage of power supply rail 807 ($VSS_{INT}$). At the same time, NMOSFET 834 is turned on, allowing current to flow from the $VDD_{OUT}$ to the $VSS_{INT}$ power supply rails. The node between resistive elements 832 and 834 will reach a potential intermediate between these two power supply rails. The drain to source resistance values for the resistive elements 832 and 834 may be set to achieve the desired node potential of ½ of the I/O pad potential, taking into account the potential difference between the I/O pad 808 and the $VDD_{OUT}$ power supply rail 804.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A circuit comprising:
   an ESD trigger generator for detecting an ESD event on an output terminal and providing an ESD signal in response thereto;
   a bias circuit for providing a bias voltage in response to the ESD signal;
   a first transistor having a first current electrode coupled to the output terminal, a control electrode coupled to the bias voltage, and a second current electrode;
   a second transistor having a first current electrode coupled to the second current electrode of the first transistor, a control electrode for receiving a logic signal, and a second current electrode coupled to a first power supply terminal.

2. A circuit comprising:
   an output driver coupled between a first power supply terminal and a second power supply terminal having first and second transistors cascoded between an output of the output driver and the second power supply terminal; and
   a voltage divider, coupled between the output of the output driver and the second power supply terminal, having an output coupled to the first transistor.

3. The circuit of claim 2, wherein the voltage divider is capacitively coupled to the second power supply terminal.

4. The circuit of claim 3, further comprising a diode which couples the voltage divider to the output of the output driver.

5. The circuit of claim 2, wherein the output of the voltage divider provides a voltage which is substantially half the voltage between the output of the output driver and the second power supply terminal.

6. The circuit of claim 2, wherein the voltage divider is coupled to the first transistor in response to an ESD event.

7. The circuit of claim 6, further comprising a third transistor for coupling the voltage divider to the first transistor.

8. The circuit of claim 7, further comprising an ESD dectector having an output which provides an ESD signal to the third transistor in response to the ESD event.

9. The circuit of claim 8, further comprising a first diode and a second diode which couple the voltage divider to the second power supply terminal.

10. The circuit of claim 7, further comprising a fourth transistor having a first current electrode coupled to the second transistor, a second current electrode coupled to the second power supply terminal, and a control electrode coupled to the output of the ESD detector.

11. The circuit of claim 10 further comprising first and second P channel transistors cascoded between a third power supply terminal and the first transistor and responsive to the ESD signal.

12. The circuit of claim 11, wherein the voltage divider comprises:
 a fifth transistor having a first current electrode coupled to the output of the output driver, a second current electrode coupled to the output of the voltage divider, and a control electrode coupled to the second power supply terminal; and
 a sixth transistor having a first current electrode coupled to the output of the voltage divider, a second current electrode coupled to the second power supply terminal, and a control electrode coupled to the output of the ESD detector.

13. The circuit of claim 2, wherein the first and second transistors are N channel transistors.

14. The circuit of claim 2, further comprising a diode which couples the voltage divider to the output terminal.

15. The circuit of claim 14, wherein the diode couples the output pad to the first power supply terminal.

16. The circuit of claim 15, further comprising::
 an ESD detector having an output which provides an ESD signal in response to an ESD event; and
 wherein the voltage divider comprises:
  a third transistor having a first current electrode coupled to the output of the output driver through the diode, a second current electrode coupled to the output of the voltage divider, and a control electrode coupled to the second power supply terminal; and
  a fourth transistor having a first current electrode coupled to the output of the voltage divider, a second current electrode coupled to the second power supply terminal, and a control electrode coupled to the output of the ESD detector.

17. A circuit comprising:
 an output driver coupled between a first power supply terminal and a second power supply terminal having first and second transistors cascoded between an output of the output driver and the second power supply terminal;
 an ESD detector having an output which provides an ESD signal in response to an ESD event; and
 a third transistor, coupled to the ESD detector which couples a gate of the second transistor to the second power supply terminal in response to an ESD event.

18. The circuit of claim 17, wherein the third transistor has a first current electrode coupled to the gate of the second transistor, a second current electrode coupled to the second power supply terminal, and a control electrode coupled to the output of the ESD detector.

19. The circuit of claim 18 wherein the first transistor is coupled to the output of the output driver, and the second transistor is coupled between the first transistor and the second power supply terminal, said circuit further comprising:
 a bias circuit which provides a first bias voltage to the first transistor at a voltage intermediate a voltage present between the output of the output driver and the second power supply terminal in response to an ESD event.

20. A circuit having a normal operation period during which power at a substantially constant voltage is applied between first and second power supply terminals and an ESD susceptible period when a constant power supply is not connected between the first and second power supply terminals, comprising:
 an output driver, coupled between the first power supply terminal and the second power supply terminal, having a first N channel transistor coupled to an output of the output driver, and a second N channel transistor coupled between the first transistor and the second power supply terminal; and
 a bias circuit which provides a first bias voltage to the first transistor at a voltage intermediate a voltage present between the output of the output driver and the second power supply terminal in response to an ESD event during the ESD susceptible period, and supplying a second bias voltage to the first N channel transistor during normal operation to ensure that the first N channel transistor is conductive during normal operation.

* * * * *